(12) United States Patent
Wu

(10) Patent No.: US 11,415,884 B2
(45) Date of Patent: Aug. 16, 2022

(54) COLOR CONVERSION LAYER AND MANUFACTURING METHOD

(71) Applicant: SHENZHEN CHINA STAR OPTOELECTRONICS SEMICONDUCTOR DISPLAY TECHNOLOGY CO., LTD., Guangdong (CN)

(72) Inventor: Yongwei Wu, Shenzhen (CN)

( * ) Notice: Subject to any disclaimer, the term of this patent is extended or adjusted under 35 U.S.C. 154(b) by 309 days.

(21) Appl. No.: 16/765,167

(22) PCT Filed: Apr. 10, 2020

(86) PCT No.: PCT/CN2020/084181
§ 371 (c)(1),
(2) Date: May 19, 2020

(87) PCT Pub. No.: WO2021/189549
PCT Pub. Date: Sep. 30, 2021

(65) Prior Publication Data
US 2022/0113625 A1    Apr. 14, 2022

(30) Foreign Application Priority Data
Mar. 27, 2020  (CN) .......................... 202010228068.0

(51) Int. Cl.
*H01L 33/50* (2010.01)
*H01L 51/50* (2006.01)
(Continued)

(52) U.S. Cl.
CPC .......... *G03F 7/0007* (2013.01); *G03F 7/0002* (2013.01); *H01L 33/507* (2013.01);
(Continued)

(58) Field of Classification Search
CPC ..... H01L 33/507; H01L 33/502; H01L 35/00; H01L 51/5036; H01L 51/56; H01L 25/0753; G03F 7/0007; G03F 7/0002
See application file for complete search history.

(56) References Cited

U.S. PATENT DOCUMENTS

| | | | |
|---|---|---|---|
| 2008/0261129 A1* | 10/2008 | Cha ........................ | B41J 2/1606 427/407.1 |
| 2010/0167214 A1* | 7/2010 | Yoon .................... | B81C 1/00031 430/323 |

(Continued)

FOREIGN PATENT DOCUMENTS

| | | |
|---|---|---|
| CN | 105700056 A | 6/2016 |
| CN | 108281092 A | 7/2018 |

(Continued)

*Primary Examiner* — Shaun M Campbell
(74) *Attorney, Agent, or Firm* — JMB Davis Ben-David

(57) ABSTRACT

A color conversion layer and a manufacturing method of the same are provided. The manufacturing method of the color conversion layer includes steps of: subjecting a block copolymer thin film to self-assembly to obtain a self-assembled block copolymer thin film, including a plurality of main parts arranged in order, and a plurality of spacing parts disposed between the plurality of main parts; forming a protective layer covering the main parts; removing the spacing parts to form a plurality of grooves arranged in order; and dropping a color conversion layer ink into the grooves, followed by drying the color conversion layer ink to obtain the color conversion layer.

11 Claims, 3 Drawing Sheets

(51) Int. Cl.
*H01L 51/56* (2006.01)
*H01L 35/00* (2006.01)
*H01L 25/075* (2006.01)
*G03F 7/00* (2006.01)

(52) U.S. Cl.
CPC .......... *H01L 35/00* (2013.01); *H01L 51/5036* (2013.01); *H01L 51/56* (2013.01); *H01L 25/0753* (2013.01); *H01L 33/502* (2013.01)

(56) References Cited

U.S. PATENT DOCUMENTS

| | | |
|---|---|---|
| 2011/0220869 A1 | 9/2011 | Cho |
| 2016/0155784 A1 | 6/2016 | Park |
| 2018/0016403 A1* | 1/2018 | Kim .......................... C08J 3/28 |
| 2020/0251451 A1* | 8/2020 | Schuele ................... H01L 33/38 |
| 2020/0371436 A1* | 11/2020 | Kim .......................... G03F 7/38 |
| 2020/0379348 A1* | 12/2020 | Osaki .................... G03F 7/0045 |

FOREIGN PATENT DOCUMENTS

| | | |
|---|---|---|
| CN | 109256455 A | 1/2019 |
| CN | 110295045 A | 10/2019 |

\* cited by examiner

COLOR CONVERSION LAYER AND MANUFACTURING METHOD

CROSS-REFERENCE TO RELATED APPLICATIONS

This is the U.S. National Stage of International Patent Application No. PCT/CN2020/084181, filed Apr. 10, 2020, which in turn claims the benefit of Chinese Patent Application No. 202010228068.0, filed Mar. 27, 2020.

BACKGROUND OF INVENTION

Field of Invention

The present application relates to the field of displays, and particularly relates to a color conversion layer and a manufacturing method of the same.

Description of Prior Art

Quantum dots and perovskite materials are used in the field of displays because of their high luminous efficiency, narrow emission spectrums and full spectrum coverage of visible light. It is known that quantum dots or perovskite materials can be dispersed in a solvent to prepare a printing ink, and the printing ink can be printed to be a light-emitting film using inkjet printing (IJP) technology, which can be used as a color conversion layer of organic light emitting diode (OLED) displays. Advantages of the inkjet printing technology are that a position where the ink is dropped can be controlled with a high precision, depositing of the ink can be controlled at a pixel level to obtain a pixel thin film with high precision, and it can be applied to manufacture large-size and high resolution display panels. When printing quantum dot or perovskite ink into a regular arrangement at a pixel level, it is necessary to pre-form a patterned structural arrangement on a substrate and then "drop" the ink to form pixels.

In view of this, the present application aims to provide a color conversion layer and a manufacturing method of the same with simple processes, low cost and high precision.

SUMMARY OF INVENTION

A manufacturing method of a color conversion layer, comprising steps of:
providing a substrate and forming a block copolymer film on the substrate;
subjecting the block copolymer film to self-assembly to obtain a self-assembled block copolymer film, wherein the self-assembled block copolymer film comprises a plurality of main parts arranged in order and a plurality of spacing parts disposed between the plurality of main parts;
forming a protective layer on the self-assembled block copolymer film, wherein the protective layer covers the main parts;
removing the spacing parts which are not covered by the protective layer to form a plurality of grooves arranged in order; and
dropping a color conversion layer ink into the grooves, followed by drying the color conversion layer to obtain a color conversion layer, wherein the color conversion layer ink comprises a color conversion material.

In one embodiment, the block copolymer film comprises a base material and a plurality of block copolymers dispersed in the base material, and the main parts are made of the block copolymers and the spacing parts are made of the base material.

In one embodiment, the block copolymer film comprises a base material and a plurality of block copolymers dispersed in the base material, the main parts are made of the base material, and the spacing parts are made of the block copolymers.

In one embodiment, the protective layer has affinity with the main body parts and has no affinity with the spacing parts.

In one embodiment, a material of the protective layer is a photoresist, and a developer is used to remove the spacing parts which are not covered by the protective layer.

In one embodiment, the developer is selected from one or more of toluene, chlorobenzene, anisole, and ethyl acetate.

In one embodiment, the plurality of main parts have a shape of a plurality of bars, a dot matrix or a mesh.

In one embodiment, the method of subjecting the block copolymer film to self-assembly is selected from one or more of thermal annealing, solvent annealing, mechanical field, and electric field.

In one embodiment, the step of subjecting the block copolymer film to self-assembling to obtain the self-assembled block copolymer film further comprises a step of subjecting the block copolymer film to self-assembling by performing mechanical power shearing.

In one embodiment, the block copolymer is selected from one or more of PI-PCEMA-PtBA, PS-PAA, PS-PB, PS-P2VP, PS-P4VP, PPV-b-PEO, PPV-b-PMMA, PA-b-PS, PI-b-PPE-b-PI, PPE-PI, PS-b-PTH-b-PS, PS-b-PTH, and PS-b-PPP.

In one embodiment, the step of providing the substrate and forming the block copolymer film on the substrate comprises steps of coating a polystyrene-b-poly(2-vinylpyridine) solution having a mass fraction of 0.5-20% on the substrate, followed by drying the polystyrene-b-poly(2-vinylpyridine) solution to obtain the block copolymer film, wherein a solvent of the polystyrene-b-poly(2-vinylpyridine) solution is selected from one or more of toluene, chlorobenzene, anisole, and ethyl acetate; and
the step of subjecting the block copolymer film to self-assembly to obtain the self-assembled block copolymer film comprises steps of subjecting the block copolymer film to self-assembly by performing mechanical power shearing and then subjecting the block copolymer film to self-assembly by performing a solvent evaporation with the solvent used selected from one or more of chloroform, acetone, and dichloroethane.

A color conversion layer is provided, comprising a film having a microstructure at a pixel level and a color conversion material dispersed in the film having the microstructure at a pixel level, the film is a self-assembled block copolymer film, the self-assembled block copolymer film comprises a plurality of main parts arranged in order and a plurality of grooves disposed between the plurality of main parts, and the color conversion material is located in the grooves.

In one embodiment, the main parts are made of self-assembled block copolymers.

In one embodiment, the main parts are made of a base material of the block copolymer thin film.

In one embodiment, the plurality of main parts have a shape of a plurality of bars, a dot matrix or a mesh.

Self-assembly effect of block copolymers is utilized in the present application, a regular arranged microstructure at a pixel level can be obtained. A precise printing of the quantum dot or perovskite materials can be achieved using the regular arranged microstructure at a pixel level so as to obtain a color conversion layer of high precision and the color conversion layer can be applied to blue backlight display technologies. Compared to prior art, the manufacturing method of the thin film with microstructure at a pixel level has advantages of simple processes, low cost and high precision.

BRIEF DESCRIPTION OF DRAWINGS

In order to more clearly illustrate the technical solution of the present application, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF PREFERRED EMBODIMENTS

The present application is further described in detail below with reference to the accompanying drawings and embodiments. Obviously, the following described embodiments are only part of the present application but not all. A person having ordinary skill in the art may obtain other embodiments based on the embodiments provided in the present application without making any creative effort, which all belong to the scope of the present application.

A color conversion layer and a manufacturing method of the same are provided by embodiments of the present application.

The color conversion layer can be applied to display panels using blue light-emitting diodes or blue micro light-emitting diodes (micro-LEDs) as backlight.

Figure 1A:
FIG. 1(a) to FIG. 1(e) are schematic views of steps of a manufacturing method of a color conversion layer according to one embodiment of the present application.

A manufacturing method of the color conversion layer includes steps of:

Please refer to FIG. 1(a), providing a substrate 10 and forming a block copolymer thin film 20 on the substrate 10.

The block copolymer thin film 20 includes a base material and block copolymers dispersed in the base material. In this step, all kind of block copolymers which can be performed with solution processing can be used as the block copolymers of the present application. The block copolymers applied includes but not limited to: PI(polyisoprene)-PCEMA(poly(2-cinnamoylethyl methacrylate))-PtBA(polybutyl acrylate), PS(polystyrene)-PAA(poly(acrylic acid)), PS(polystyrene)-PB(polybutadiene), PS(polystyrene)-P2VP(poly-2-vinylpyridine), PS(polystyrene)-P4VP(poly-4-vinylpyridine), PPV(poly-p-styrene)-b-PEO(polyethylene oxide), PPV(poly-p-styrene)-b-PMMA(poly(methyl methacrylate)), PA(polyacetylene)-b-PS(polystyrene), PI(polyisoprene)-b-PPE(polyphenylene ether)-b-PI(polyisoprene), PPE(polyphenylene ether)-PI(polyisoprene), PS(polystyrene)-b-PTH(polythiophene)-b-PS(polystyrene), PS(polystyrene)-b-PTH(polythiophene), PS(polystyrene)-b-PPP(polyparaphenylene) etc.

In one embodiment of the present application, the block copolymer thin film 20 is a PS(polystyrene)-P2VP(poly-2-vinylpyridine) thin film. The step of forming a block copolymer thin film 20 on the substrate 10 includes coating a polystyrene-b-poly(2-vinylpyridine) solution having a mass fraction of 0.5-20% on the substrate 10, followed by drying the polystyrene-b-poly(2-vinylpyridine) solution to obtain the block copolymer thin film. A solvent of the polystyrene-b-poly(2-vinylpyridine) solution is selected from one or more of toluene, chlorobenzene, anisole, and ethyl acetate.

Figure 1B:
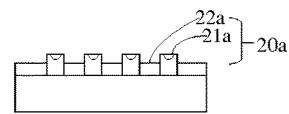
Figure 2A:
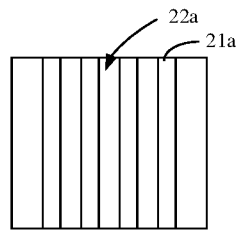
FIG. 2(a) to FIG. 2(c) are schematic plan views of self-assembled block copolymer thin films according to one embodiment of the present application.
Figure 2B:
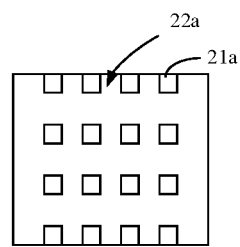
Figure 2C:
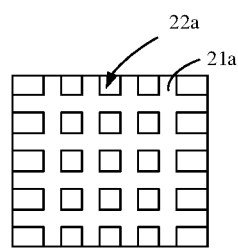

Please refer to FIG. 1(b), subjecting the block copolymer thin film 20 to self-assembly to obtain a self-assembled block copolymer thin film 20a. Wherein the self-assembled block copolymer thin film 20a includes a plurality of main parts 21a arranged in order and a plurality of spacing parts 22a disposed between the plurality of main parts 21a. Both sizes of the main part 21a and the spacing part 22a formed by self-assembly of block copolymers are about a few tens of microns, and the self-assembled block copolymer thin film 20a has a microstructure at a pixel level. Please refer to FIG. 2(a), in one embodiment, the plurality of main part 21a can be in a shape of a plurality of bars arranged along a first direction. Please refer to FIG. 2(b), in one embodiment, the plurality of main parts can be in a shape of a dot matrix. Please refer to FIG. 2(c), in one embodiment, the plurality of main parts can be in a shape of a mesh. Different types of self-assembled block copolymers can be used for different purposes. The main parts 21a are formed by the self-assembly of the block copolymers. And the spacing parts 22a are made of the base material of the block copolymer thin film 20.

A method for the block copolymer thin film to self-assemble is selected from one or more of thermal annealing, solvent annealing, mechanical field and electric field. In this step, a pre-assembly of the block copolymer thin film 20 can be performed and then an official self-assembly of the block copolymer thin film 20 can be performed.

In one embodiment, the pre-assembly of the block copolymer thin film 20 can be performed by performing mechanical power shearing and the block copolymer thin film 20 is then self-assembled by performing a solvent evaporation. Wherein a solvent used to perform the solvent evaporation is selected from one or more of chloroform, acetone, and dichloroethane. In this process, mechanical shearing power induces an alignment of the block copolymers, namely a macroscopic arrangement in order; and then an evaporation is performed using solvent vapor (namely a solvent annealing), microcosmic defects can be eliminated by the solvent evaporation without destroying a long-range order induced by the mechanical power shearing.

Figure 1C:
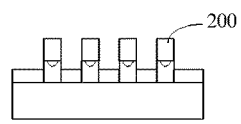

Please refer to FIG. 1(c), forming a protective layer 200 on the self-assembled block copolymer thin film 20a, and the protective layer 200 covers the main parts 21a. In this embodiment, the protective layer 200 has an affinity with the main parts 21a. That is to say, the protective layer 200 has an affinity with the block copolymers. On the other hand, the protective layer 200 has a bad or an opposite affinity with the spacing parts 22a. For example, when the block copolymers are hydrophilic polymers, the protective layer 200 is hydrophilic, and the base material is lipophilic. When forming a protective layer 200 on the self-assembled block copolymer thin film 20a, the protective layer 200 assembles on the main parts 21a and covers the main parts 21a and does not cover the spacing parts 22a.

Figure 1D:
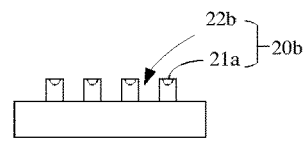

Please refer to FIG. 1(d), removing the self-assembled block copolymer thin film 20a which is not covered by the protective layer 200, namely the spacing parts 22a to provide a plurality of grooves 22b arranged in order in the self-assembled block copolymer thin film 20. A thin film 20b having the microstructure of the pixel level is obtained. A material of the protective layer 200 is a photoresist, and the spacing parts 22a which are not covered by the protective layer 200 can be removed by a developer. The developer is selected from one or more of toluene, chlorobenzene, anisole, and ethyl acetate.

In another embodiment of the present application, in the steps of FIG. 1(c) to FIG. 1(d), the spacing parts 22a are formed by the self-assembly of the block copolymers, and the main parts 21a are made of the base material. The protective layer 200 has an affinity with the base material. On the other hand, the block copolymers have a bad affinity, or an opposite affinity to the base material. In this embodiment, the grooves 22b are formed by removing the self-assembled block copolymers from the self-assembled block copolymer thin film 20a.

Figure 1E:
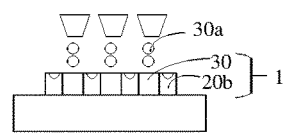

Please refer to FIG. 1(e), dropping a color conversion layer ink 30a into the grooves 22b followed by drying the color conversion layer ink 30a to obtain a color conversion layer 1. The color conversion layer ink 30a includes a color conversion layer material 30. The color conversion material 30 includes quantum dots or perovskite. The color conversion layer 1 configured to convert blue light can be manufactured using red, green, and blue ink. The color conversion layer 1 includes the thin film 20b having the microstructure at the pixel level and the color conversion material 30 dispersed in the thin film 20b having the microstructure at the pixel level. The thin film 20b having the microstructure at the pixel level includes the plurality of main parts 21a arranged in order and the plurality of grooves 22b disposed between the plurality of main parts 21a, and the color conversion material 30 is located in the grooves 22b. That is to say, the color conversion layer 1 includes a plurality of spacers and red pixel units, green pixel units and blue pixel units (or transparent pixel units) disposed between the spacers.

The quantum dots used in the present application can be core-shell structural quantum dots commonly used in the technical field. Wherein, materials of the core and the shell are not limited, and can, for example, be selected from a group of binary semiconductor materials consisting of ZnS, ZnSe, ZnTe, CdS, CdSe, CdTe, MnSe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe and PbTe; or a group of ternary semiconductor materials or semiconductor materials with more elements consisting of CdxZn1-xSe, CdxZn1-xS, CuInS2, CuInSe2, AgInS2, AgInSe2, InxGa1-xP, CdxZn1-xSySe1-y; or a group of doped semiconductor materials consisting of MnSe:Cu, MnSe:Mn, CdS:Cu, CdS:Mn, In2S3:Cu, ZnO:Cu, ZnO:Mn.

Figure 3:
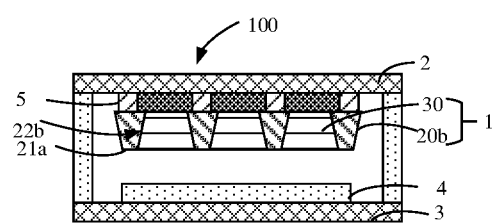
FIG. 3 is a structural schematic view of a display panel according to one embodiment of the present disclosure.

Please refer to FIG. 3, the color conversion layer 1 can be applied to a display panel 100. The display panel 100 includes a first substrate 2, a second substrate 3 and a blue light-emitting layer 4 and the color conversion layer 1 disposed between the first substrate 2 and the second substrate 3. The color conversion layer 1 is disposed on a light-emitting side of the blue light-emitting layer 4. In one embodiment, the color conversion layer 1 is disposed on the second substrate 2. The blue light-emitting layer 4 is disposed on the second substrate 3. The display panel 100 further includes a color filter layer 5 disposed between the first substrate 2 and the color conversion layer 1. In another embodiment, both the blue light-emitting layer 4 and the color conversion layer are disposed on the second substrate 3.

The blue light-emitting layer 4 includes blue light-emitting diodes or blue micro light-emitting diodes.

The color conversion layer 1 includes a thin film 20b having the microstructure at the pixel level and the color conversion material 30 dispersed in the thin film 20b having the microstructure at the pixel level. The thin film 20b is the self-assembled block copolymer thin film 20a. The plurality of main parts 21a arranged in order and the plurality of grooves 22b disposed between the plurality of main parts 21a are formed in the self-assembled block copolymer thin film 20a, and the color conversion material 30 is located in the grooves. The color conversion material 30 includes the quantum dots or the perovskite.

Self-assembly effect of the block copolymers is utilized in the present application, a regular arranged microstructure of the pixel level can be obtained. A precise printing of the quantum dot or perovskite materials can be achieved using the regular arranged microstructure of the pixel level so as to obtain a color conversion layer of high precision and the color conversion layer can be applied to blue backlight display technologies. Compared to prior art, the manufacturing method of the thin film with microstructure of the pixel level has advantages of simple processes, low cost and high precision.

The above description provides a detailed introduction to the application. In this disclosure, specific examples are applied to explain principle and embodiments of the application. The description of the above embodiments is only used to help understand the application. At the same time, for those skilled in the art, according to the thought of the present application, there will be changes in the specific embodiments and application scope. In conclusion, the content of the specification should not be understood as the limitation of the application.

What is claimed is:

1. A manufacturing method of a color conversion layer, comprising steps of:
   providing a substrate and forming a block copolymer film on the substrate;
   subjecting the block copolymer film to self-assembly to obtain a self-assembled block copolymer film, wherein the self-assembled block copolymer film comprises a plurality of main parts arranged in order and a plurality of spacing parts disposed between the plurality of main parts;
   forming a protective layer on the self-assembled block copolymer film, wherein the protective layer covers the main parts;
   removing the spacing parts which are not covered by the protective layer to form a plurality of grooves arranged in order; and
   dropping a color conversion layer ink into the grooves, followed by drying the color conversion layer to obtain a color conversion layer, wherein the color conversion layer ink comprises a color conversion material.

2. The manufacturing method of the color conversion layer of claim 1, wherein the block copolymer film comprises a base material and a plurality of block copolymers dispersed in the base material, and the main parts are made of the block copolymers and the spacing parts are made of the base material.

3. The manufacturing method of the color conversion layer of claim 1, wherein the block copolymer film comprises a base material and a plurality of block copolymers dispersed in the base material, the main parts are made of the base material, and the spacing parts are made of the block copolymers.

4. The manufacturing method of the color conversion layer of claim 1, wherein the protective layer has affinity with the main body parts and has no affinity with the spacing parts.

5. The manufacturing method of the color conversion layer of claim 1, wherein a material of the protective layer is a photoresist, and a developer is used to remove the spacing parts which are not covered by the protective layer.

6. The manufacturing method of the color conversion layer of claim 5, wherein the developer is selected from one or more of toluene, chlorobenzene, anisole, and ethyl acetate.

7. The manufacturing method of the color conversion layer of claim 1, wherein the plurality of main parts have a shape of a plurality of bars, a dot matrix or a mesh.

8. The manufacturing method of the color conversion layer of claim 1, wherein the method of subjecting the block copolymer film to self-assembly is selected from one or more of thermal annealing, solvent annealing, mechanical field, and electric field.

9. The manufacturing method of the color conversion layer of claim 1, wherein the step of subjecting the block copolymer film to self-assembling to obtain the self-assembled block copolymer film further comprises a step of subjecting the block copolymer film to self-assembling by performing mechanical power shearing.

10. The manufacturing method of the color conversion layer of claim 1, wherein the block copolymer is selected from one or more of PI-PCEMA-PtBA, PS-PAA, PS-PB, PS-P2VP, PS-P4VP, PPV-b-PEO, PPV-b-PMMA, PA-b-PS, PI-b-PPE-b-PI, PPE-PI, PS-b-PTH-b-PS, PS-b-PTH, and PS-b-PPP.

11. The manufacturing method of the color conversion layer of claim 1, wherein the step of providing the substrate and forming the block copolymer film on the substrate comprises steps of coating a polystyrene-b-poly(2-vinylpyridine) solution having a mass fraction of 0.5-20% on the substrate, followed by drying the polystyrene-b-poly(2-vinylpyridine) solution to obtain the block copolymer film, wherein a solvent of the polystyrene-b-poly(2-vinylpyridine) solution is selected from one or more of toluene, chlorobenzene, anisole, and ethyl acetate; and the step of subjecting the block copolymer film to self-assembly to obtain the self-assembled block copolymer film comprises steps of subjecting the block copolymer film to self-assembly by performing mechanical power shearing and then subjecting the block copolymer film to self-assembly by performing a solvent evaporation with the solvent used selected from one or more of chloroform, acetone, and dichloroethane.

* * * * *